United States Patent
Hsu et al.

(10) Patent No.: US 12,419,008 B2
(45) Date of Patent: Sep. 16, 2025

(54) IMMERSION COOLING USING COOLING CONTAINERS FOR AN ELECTRONIC DEVICE

(71) Applicant: HEWLETT PACKARD ENTERPRISE DEVELOPMENT LP, Spring, TX (US)

(72) Inventors: Ching-Chun Hsu, Taipei (TW); Kai Zhang, Taipei (TW); Sung-Hsia Kuo, Taipei (TW); Hsin Chang Lu, Taipei (TW); John R. Grady, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 203 days.

(21) Appl. No.: 18/308,814

(22) Filed: Apr. 28, 2023

(65) Prior Publication Data
US 2024/0365502 A1 Oct. 31, 2024

(51) Int. Cl.
*H05K 7/20* (2006.01)
(52) U.S. Cl.
CPC ..... *H05K 7/20236* (2013.01); *H05K 7/20263* (2013.01); *H05K 7/20272* (2013.01); *H05K 7/20772* (2013.01); *H05K 7/20836* (2013.01)
(58) Field of Classification Search
CPC combination set(s) only.
See application file for complete search history.

(56) References Cited

U.S. PATENT DOCUMENTS

| | | | | |
|---|---|---|---|---|
| 8,934,250 | B2 * | 1/2015 | Campbell | H05K 7/20236 257/714 |
| 8,953,320 | B2 * | 2/2015 | Campbell | F28D 15/046 165/185 |
| 10,827,649 | B2 * | 11/2020 | Lunsman | H05K 7/20927 |
| 11,096,313 | B2 * | 8/2021 | Amos | H05K 7/20772 |
| 11,452,237 | B2 * | 9/2022 | Tan | H05K 7/20272 |
| 11,470,739 | B2 * | 10/2022 | Amos | H01L 23/473 |
| 11,882,670 | B2 * | 1/2024 | Gao | H05K 7/20772 |
| 11,968,802 | B2 * | 4/2024 | Amos | H05K 7/20772 |
| 12,114,469 | B2 * | 10/2024 | Heydari | H05K 7/20781 |
| 12,120,851 | B2 * | 10/2024 | Trieu | H05K 7/20309 |
| 12,150,282 | B2 * | 11/2024 | Best | H05K 7/20781 |
| 12,156,371 | B2 * | 11/2024 | Clerc | H05K 7/20781 |
| 12,156,372 | B2 * | 11/2024 | Dogruoz | H05K 7/2089 |

(Continued)

*Primary Examiner* — Lisa Lea-Edmonds
(74) *Attorney, Agent, or Firm* — Hewlett Packard Enterprise Patent Department (57) ABSTRACT

An electronic device includes a chassis, electronic components disposed within the chassis, cooling containers, and a coolant loop. The chassis has an internal volume partly filled with coolant to form coolant pool in the internal volume. The containers are disposed within the chassis such that each container contains at least one electronic component. The coolant loop circulates the coolant from the coolant pool to the containers. For example, each container receives an inflow of the coolant from the coolant loop or from another one container and immerse the at least one electronic component in the coolant to remove heat from the at least one electronic component and output an outflow of the coolant that overflows into the coolant pool or into at least one adjacent container, where a level of the coolant in the coolant pool is lower than respective levels of the coolant in the containers.

20 Claims, 5 Drawing Sheets

(56) References Cited

U.S. PATENT DOCUMENTS

| | | | |
|---|---|---|---|
| 12,185,496 B2* | 12/2024 | Coxe, III | H05K 7/20254 |
| 12,193,194 B2* | 1/2025 | Heydari | H05K 7/2079 |
| 12,200,909 B2* | 1/2025 | Heydari | H05K 7/20772 |
| 12,225,688 B2* | 2/2025 | Archibald | G05D 23/1931 |
| 2010/0103614 A1* | 4/2010 | Campbell | H05K 7/203 |
| | | | 361/689 |
| 2012/0106083 A1* | 5/2012 | Toftloekke | H01L 23/473 |
| | | | 361/698 |
| 2019/0182988 A1* | 6/2019 | Lunsman | H05K 7/20281 |
| 2021/0321535 A1* | 10/2021 | Amos | H01L 23/473 |
| 2022/0201896 A1* | 6/2022 | Edmunds | H05K 7/20254 |
| 2022/0240416 A1* | 7/2022 | Lunsman | H05K 7/20809 |
| 2022/0418153 A1* | 12/2022 | Amos | H05K 7/20263 |
| 2023/0096875 A1* | 3/2023 | Edmunds | H05K 7/20772 |
| | | | 361/689 |
| 2023/0217625 A1* | 7/2023 | Gao | H05K 7/20781 |
| 2023/0217629 A1* | 7/2023 | Amos | H01L 23/473 |
| | | | 165/80.4 |
| 2023/0240042 A1* | 7/2023 | Amos | H01L 23/3677 |
| 2023/0345668 A1* | 10/2023 | Lunsman | H05K 7/20809 |
| 2024/0365502 A1* | 10/2024 | Hsu | H05K 7/20772 |

\* cited by examiner

IMMERSION COOLING USING COOLING CONTAINERS FOR AN ELECTRONIC DEVICE

BACKGROUND

Datacenters typically include racks, where each rack has multiple electronic devices, which are configured to execute workloads. Generally, some electronic components (e.g., a central processing unit (CPU), graphics processing unit (GPU), or the like) of such electronic devices may consume high amounts of power, thereby increasing the power density of the rack and the amount of heat generated from such electronic devices. Cooling techniques, such as air cooling techniques are typically deployed to remove heat from the electronic devices. However, since air does not have good heat transfer capabilities, the air cooling techniques may not be very efficient in removing heat from the electronic devices. Further, as the power of electronic devices increases, air cooling techniques may require additional power to sufficiently cool the electronic devices, resulting in a higher power density of the rack. Hence, a new cooling technique, such as immersion cooling may be deployed in the datacenter, which may use liquid coolant instead of air to remove heat from the electronic devices. By utilizing the superior heat transfer capabilities of the liquid coolant compared to air, electronic devices may be cooled more efficiently, thus reducing the overall power usage of the datacenter.

BRIEF DESCRIPTION OF THE DRAWINGS

Various examples will be described below with reference to the following figures.

DETAILED DESCRIPTION

The following detailed description refers to the accompanying drawings. For purposes of explanation, certain examples are described with reference to the components illustrated in FIGS. 1-4. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

Immersion cooling may require electronic devices to be completely submerged in coolant to remove heat from electronic components of the electronic devices. For example, previously immersion cooling has generally involved providing a tank, a tub, or other large container to hold multiple servers and to be filled with liquid coolant. Such immersion cooling tank may be similar to a traditional rack of the datacenter in terms of their size and the number of servers or other electronic devices housed therein, but unlike a traditional rack the immersion cooling tank is liquid tight and filled with the coolant such that the electronic devices may be completely submerged in the coolant to remove heat from the electronic components. The immersion cooling may further require periodic circulation of the coolant in the tank to a heat exchanger to remove heat from the coolant and refill the tank with the coolant. Since the tank is completely filled with the coolant, the tank may be very heavy (much heavier than a traditional rack of equivalent size) and may require a large quantity of coolant to submerge the electronic devices. The coolant generally needs to be an electrically non-conductive liquid to avoid damaging the electronic components, and thus the coolant can be expensive, especially when used in large quantities as may be needed for traditional immersion cooling. Further, since the electronic devices need to be completely submerged in the coolant, the tank may have to be oriented with its longest side extending along the floor (e.g., horizontally oriented) to accommodate multiple electronic devices, thereby increasing floor space requirements in the datacenter to deploy the tank (as compared to traditional racks, which are generally oriented with the longest side extending vertically). Since traditional racks typically extend along its height (e.g., vertically oriented), for implementing such immersion cooling, the datacenter may have to include a new infrastructure (e.g., a horizontally oriented tank and also a new coolant distribution unit (CDU)). Therefore, the existing infrastructure (e.g., vertically oriented traditional rack) cannot be reused. Additionally, since all the electronic devices are completely submerged in the same liquid coolant filled in the tank, the high and low-power consuming electronic components of all such electronic devices are provided with the same coolant, which may result in poor heat dissipation from such high-powered electronic components, and also may necessitate frequent circulation of the coolant from the tank to heat exchanger for removal of heat from the coolant. Additionally, since the electronic devices are completely submerged in the liquid coolant in the tank, it can be difficult to service (e.g., add, remove, replace, or perform maintenance on) individual electronic components (e.g., storage drives, PCIe add-on cards, memory, processors, etc.) or to change how communication cables are coupled to the electronic device, because such actions may require removing the entire electronic device from the tank. This removal of the entire electronic device from the tank can be messy, since the device is submerged, and thus servicing may be more complicated, difficult, and time consuming than it would be to perform a similar service on an electronic device in a traditional rack. In addition, the electronic device may be forced to undergo unavoidable shut down during such events (because it is removed entirely from the tank), and therefore hot swapping (adding, removing, or replacing electronic components to the electronic device while the electronic device is still running) may not be possible.

A technical solution to the aforementioned problems includes partially filling individual electronic devices (e.g., servers) with liquid coolant such that the electronic components within the electronic device are submerged but the entire electronic device is not itself submerged (i.e., the coolant is contained within the interior of the chassis of the electronic device). Thus, immersion cooling is provided for the electronic components of the electronic devices on a per-device basis, instead of fully immersing multiple electronic devices in a large tank.

More specifically, in some examples the technical solution includes providing an electronic device that includes a chassis and multiple cooling containers disposed within the chassis, each containing at least one electronic component, where the chassis and the cooling containers are at least partially filled with coolant to immerse the electronic components of the electronic device. The chassis (or a structure disposed therein) defines a volume that can hold coolant (e.g., the volume may be liquid tight on at least a bottom and all lateral sides thereof), and this volume may be partially filled with the coolant to form a coolant pool. The multiple cooling containers may be deployed in the chassis of the electronic device and communicably coupled to the coolant pool such that the coolant can be circulated between the coolant pool and each cooling container. That is, each cooling container may contain at least one electronic component and receive the coolant from the coolant pool via a coolant loop to immerse the at least electronic component with the coolant to remove heat generated from such electronic component. The heated coolant may then be returned from the cooling containers to the coolant pool, the heated coolant may be cooled (e.g., by a heat exchanger), and then the coolant may be input again into the cooling containers.

In examples disclosed herein, because the entire electronic device is not submerged, the entire electronic device does not need to be completely removed from its environment to allow for service, for example, the electronic device can be serviced while still installed in a rack. Thus, examples disclosed herein may allow for servicing to occur without necessarily requiring shutting down of the electronic device. In addition, the mess and complication associated with removing a large and heavy electronic device from an immersion tank and draining the coolant therefrom can be avoided. Moreover, in some examples, the volume that contains the coolant pool and some or all of the cooling containers may be open on a top side thereof (or have a cover that is removeable on the top side thereof). This can make servicing electronic components even easier, as it can allow a user to access the electronic components within a given cooling container, for example, an electronic component can be added or removed by simply inserting or removing the electronic component through the open top side of the corresponding cooling container. Furthermore, in many cases, such servicing can be performed even while the coolant remains present around the electronic components. In other cases, if it is desired for the coolant to not be present around the electronic components during the servicing, then it may be possible to drain just the cooling container that contains the electronic components being serviced, without necessarily needing to drain the entire electronic device.

In some examples, some or all of the cooling containers are contained within the volume defined in the chassis, and these cooling containers may define sub-compartments within the larger volume. Dividing up the volume into sub compartments via the cooling containers may be beneficial, as compared to just having one volume within the chassis to hold the coolant, at least because the cooling containers may allow for certain electronic components to be fully submersed without requiring as high of a liquid level within the overall volume. For example, if only the one volume were provided and if one or more electronic components are relatively tall compared to the remainder of electronic components, then the liquid level within the volume would need to be relatively high to ensure that the tall electronic component is fully immersed, and this may result in a large amount of coolant being used, which can be costly and make the electronic device very heavy. But if the tall electronic components can be enclosed with smaller compartments, then the liquid level can be high only within the smaller compartments to fully immerse the tall electronic component, while allowing the liquid level within the larger volume to remain relatively low, thus reducing the overall amount of coolant that is used. In addition, by segregating certain electronic components into separate compartments, an order or priority of cooling can be imposed by providing the coolant to some cooling containers prior to (i.e., upstream of) other cooling containers, which allows electronic components that need colder coolant to receive the coolant before it has been heated by other electronic components, and electronic components that can tolerate warmer coolant to receive the coolant after it has removed heat from other electronic components in another cooling container upstream thereof.

In some examples, some of the cooling containers may receive coolant directly from the coolant loop, while others of the cooling containers may receive coolant from another one of the cooling containers. For example, one or more of the cooling containers may be designed to overflow the coolant to the coolant pool or to adjacent cooling containers to circulate the coolant.

In some examples, one or more electronic components of the electronic device are immersed in the coolant pool in the volume (as opposed to being disposed in one of the cooling containers). This allows the coolant to further remove heat from the PCB disposed in the chassis and also from the electronic components located within the cooling container. For example, in some implementations a printed circuit board (PCB) (e.g., a main system board or a motherboard) is disposed within the volume and at least a portion of the PCB is immersed in the coolant pool in the volume. In some of these examples, some or all of the cooling containers may be coupled to the PCB and may contain electronic components that are mounted to the PCB. In other words, some portions of the PCB are immersed in the coolant pool in the larger volume, while other electronic components mounted to the PCB are segregated into separate compartments via the cooling containers. For example, in some implementations, some of the cooling containers may include lateral walls that define a perimeter laterally encircling at least one electronic component, and the lateral walls are coupled to, and extend perpendicularly from, the face of the PCB upon which the at least one electronic component is mounted such that a portion of the face of the PCB defines a bottom wall of the cooling container. Thus, for example, a portion of the face of the PCB that is located outside of the cooling container may be immersed within the coolant pool, while the portion of the face of the PCB that is located within the cooling container may be immersed within a separate pool contained within the cooling container, wherein the liquid in the cooling container may have a different temperature and/or a different level (height) than the liquid in the coolant pool. Segregating portions of the PCB such that some are immersed within the coolant pool while other portion are immersed within the cooling containers coupled to the PCB can allow for colder coolant to be provided to the electronic components in the cooling containers (such as a processor or CPU), which may generate more heat and/or be more heat sensitive, while warmer coolant is provided to the remainder of the PCB, which may generate less heat and/or be less heat sensitive, which allows for more efficient cooling as noted above.

In some examples, a first cooling container may be deployed containing a high-powered electronic component, such as a CPU or a GPU to receive the coolant directly from the coolant loop, remove heat from such high-powered electronic component. Later, the first cooling container may be fluidically coupled to a second cooling container, which may be deployed containing a low-powered electronic component (e.g., DIMMS) to receive the coolant from the first cooling container. In particular, the first cooling container may be designed to overflow the coolant to the second cooling container. In such examples, the second cooling container may immerse the low-powered electronic component with the coolant received from the first cooling container to remove heat from such low-powered electronic component. Later, the second cooling container may overflow the coolant into the coolant pool. The coolant in the coolant pool may cool portions of a primary circuit board of the electronic device (i.e., the portions not contained within the cooling containers).

The coolant loop may include a pump, which may be fluidically coupled to a coolant collector disposed in the coolant pool via a heat exchanger. In such examples, the pump may draw the coolant through the heat exchanger, causing the heat exchanger to remove heat from the coolant, and provide the coolant to the multiple cooling containers of the electronic device.

In some examples, the pump may be a passive pump, which may be configured to circulate the coolant to the multiple cooling containers at a constant flow rate. In some other examples, the pump may be an active pump, which may be regulated by a controller to vary the flow rate of the coolant supplied to the multiple cooling containers based on temperature of coolant in each of the multiple cooling containers.

Since the electronic devices may not need to be completely submerged in the coolant, a vertically extending rack (e.g., the rack that extends along its height) can be used to stack the electronic devices one on top of other, thereby reducing the floor space required for deploying multiple electronic devices. For example, the rack can utilize the vertical space e.g., up to 50 U or 60 U, hence the floor space utilization is more optimized than the horizontally oriented tank. The ability to use vertically oriented racks to hold the electronic devices may also be facilitated, in part, because in some examples the electronic devices are only partially filled with the coolant. In particular, the usage of cooling containers to define segregated compartments may allow for the overall level of liquid in the coolant pool to be relatively low and thus less coolant is needed, as already described above, and this can greatly reduce the weight of the electronic devices as compared to an electronic device that is fully filled with coolant. This reduction in weight allows the electronic devices to more easily be disposed in vertically oriented racks, as very heavy electronic devices may be too difficult to install in vertically oriented racks. Further, since the electronic devices are not completely submerged in the coolant and also since the electronic devices are stacked vertically, each electronic device may be partially pulled from the rack, for accessing the electronic components within a corresponding electronic device to perform service and maintenance activities, without shutting down the corresponding electronic device. Further, each electronic device requires less coolant when compared to traditional immersion cooling, thereby reducing the weight of the electronic device and the rack. Additionally, since the existing infrastructure (e.g., the traditional rack and the CDU) can be reused, the cost of deployment of immersion cooling with cooling containers may be significantly reduced when compared to traditional immersion cooling implementations. Accordingly, immersion cooling using cooling containers may allow to significantly improve cooling capabilities of the electronic device, while reducing power utilization of the electronic device.

Figure 1A:
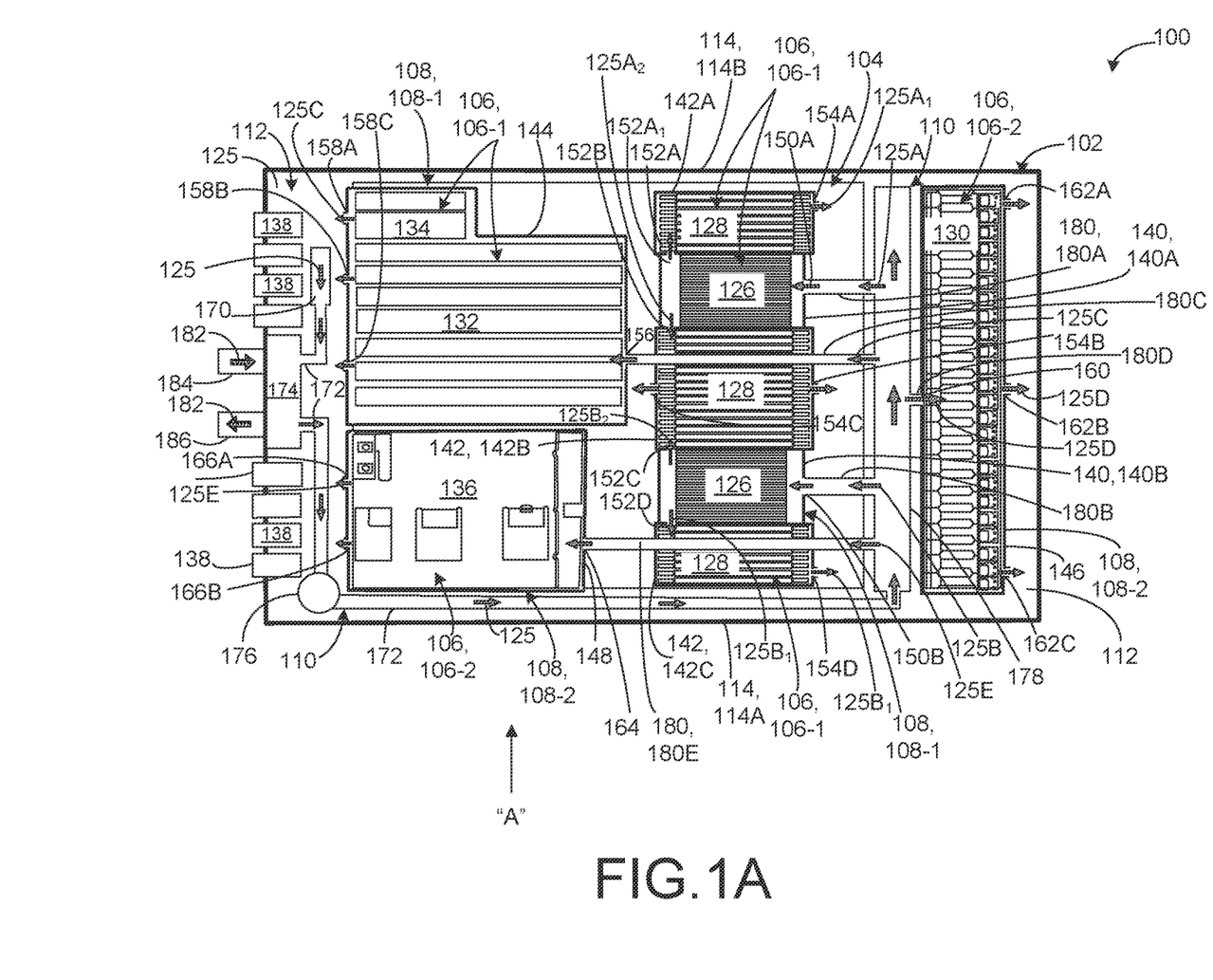
FIG. 1A illustrates a top view of an electronic device according to an example of the present disclosure.
Figure 1B:
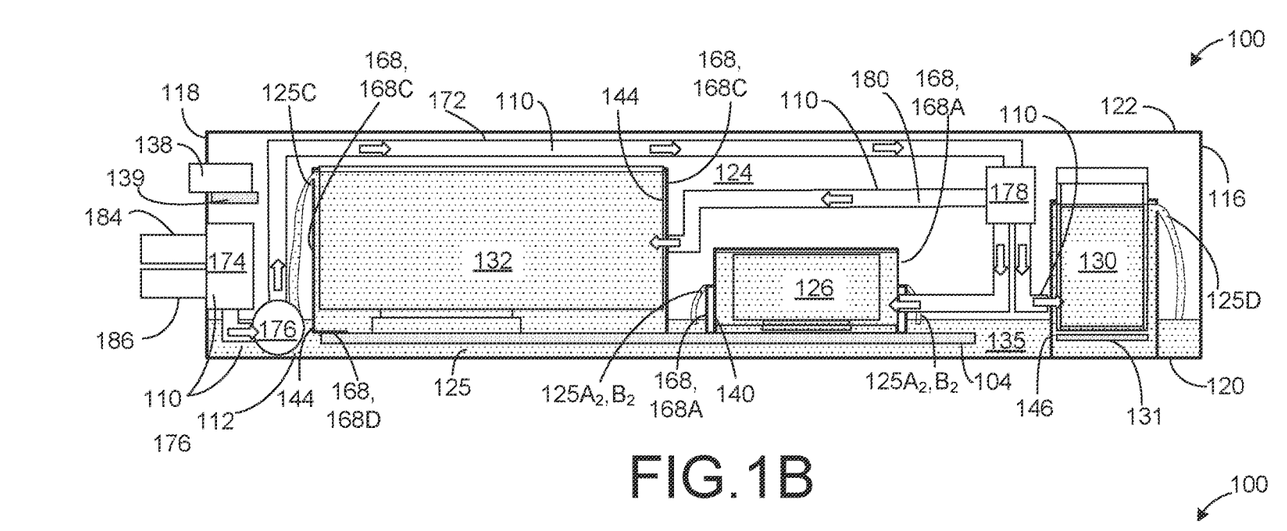
FIG. 1B illustrates a side view of the electronic device of FIG. 1A illustrated while viewing from direction "A" in FIG. 1A according to an example of the present disclosure.
Figure 1C:
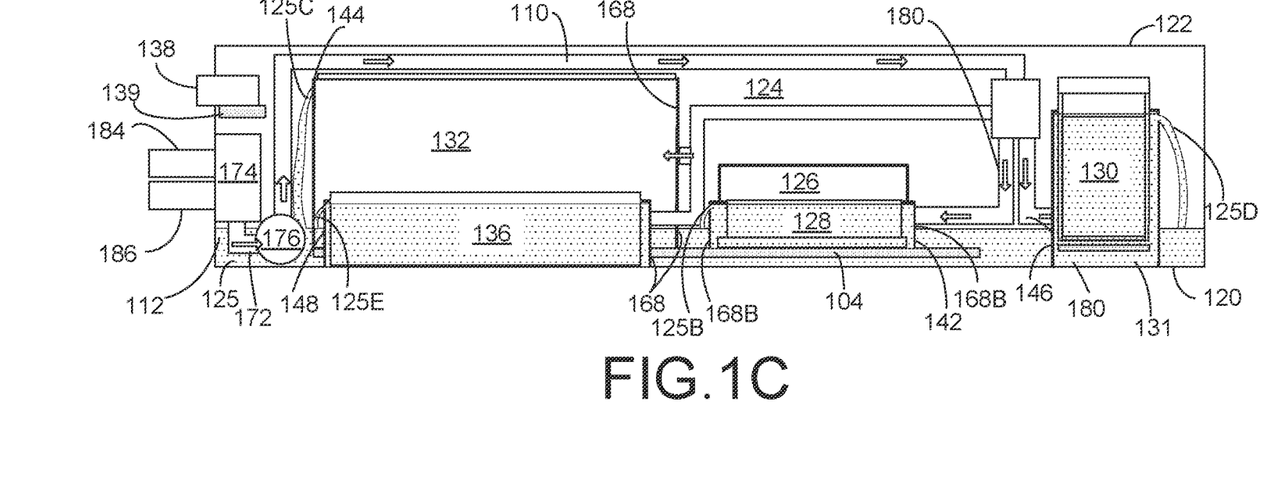
FIG. 1C illustrates another side view of the electronic device of FIG. 1A illustrated while viewing from direction "A" in FIG. 1A according to the example of the present disclosure.

Referring to the Figures, FIG. 1A depicts a top view of an electronic device 100. FIG. 1B depicts a side view of the electronic device 100 illustrated while viewing from direction "A". FIG. 1C depicts another side view of the electronic device 100 illustrated while viewing from the direction "A". In the description hereinafter, FIGS. 1A-1C are described concurrently for ease of illustration. It should be understood that each of the Figures, FIGS. 1A-1C is not intended to illustrate specific shapes, dimensions, or other structural details accurately or to scale, and that implementations of the electronic device 100 may have different numbers and arrangements of the illustrated components and may also include other parts that are not illustrated.

In some examples, the electronic device 100 may be a computer (e.g., a server, a storage device), a networking device (e.g., a switch), or the like. In the example of FIGS. 1A-1C, the electronic device 100 is a server. The electronic device 100 includes a chassis 102, a primary circuit board 104, a plurality of electronic components 106, a plurality of cooling containers 108, and a coolant loop 110.

The chassis 102 includes a pair of lateral sidewalls 114, a front panel 116, a rear panel 118, a base 120, and a top lid 122. In such examples, the base 120 is coupled to the pair of lateral sidewalls 114, the front panel 116, and the rear panel 118 to define an internal volume 124 of the chassis 102. Further, the top lid 122 is coupled to the pair of lateral sidewalls 114 and/or to the front panel 116 and the rear panel 118 to define an enclosure. In some examples, the top lid 122 may be configured to be opened or removed from the lateral sidewalls 114 to allow access to the internal volume 124. For example, the top lid 122 may be pivotably coupled to one of the lateral sidewalls 114 and removably engaged with the lateral sidewalls 114 so that the top lid 122 can be tilted up to open the chassis 102 and provide access to the internal volume 124 of the chassis 102. As another example, the top lid 122 may be removably attached to the lateral sidewalls by thumbscrews, latches, sliding rails, or any other attachment mechanisms that allow for removal or opening of the top lid 122. The chassis 102 is partly filled with coolant 125 to form a coolant pool 112 in the internal volume 124 of the chassis 102. It may be noted that a first lateral sidewall 114A among the pair of lateral sidewalls 114, a fifth container 148, one or more power supply units 136, a second cooling container 142C, and one or more memory modules 128 of FIG. 1A are shown to be transparent in FIG. 1B to illustrate other elements of the electronic device 100. Further, the first lateral sidewall 114A of FIG. 1A is shown to be transparent in FIG. 1C to illustrate other elements of the electronic device 100.

In some examples, the base 120, the pair of lateral sidewalls 114, the front panel 116, and the rear panel 118 may be sealed to each other with a liquid-tight seal for preventing leakage of the coolant 125 from the chassis 102. In other words, in some examples the chassis 102 is a liquid tight enclosure. This may allow the coolant pool 112 to be contained by the chassis 102. References herein to the lateral sidewalls 114 and/or front/back panels 116, 118, and/or chassis 102 being sealed or liquid tight should be understood as referring to the lateral sidewalls 114 or front/back panels 116, 118 or chassis being sealed along at least the lower portions thereof (i.e., from the base 120 up to at least a height that exceeds the level of the coolant pool 112), but such references do not imply that the entire chassis 102 is completely sealed all around unless explicitly indicated otherwise. Thus, for example, a chassis 102 may be referred to as sealed herein even if the chassis 100 includes apertures which are not sealed (e.g., for power and/or communication connectors), so long as those apertures are located higher than the level of the coolant pool 112. Furthermore, in some examples the top lid 122 is not necessarily sealed to the lateral sidewalls 114 or front/back panels 116, 118.

In other examples, an additional structure (not illustrated) having a bottom wall and lateral walls coupled thereto to form a liquid tight cooling container with an open top, is disposed within the chassis 102 on top of the base 120. This structure may be referred to herein as a tub. The tub may be disposed between the base 120 and some or all of the electronic components of the of the electronic device 100. In other words, some or all of the electronic components are disposed at least partially in the tub and the tub is disposed in the bottom of the chassis 102. Moreover, the coolant pool 112 may be disposed in the tub. The tub may serve as a way to hold the coolant 125 within the electronic device 100 without necessarily requiring that the chassis 102 be liquid tight. Or the chassis 102 may be liquid tight and yet still include the tub as a form of redundant protection against leaks. In some examples that include such a tub, the tub might not extend fully across the entirety of the base 102, and thus the coolant pool 112 might not fully cover the entirety of the base 102.

In one or more examples, the coolant 125 may be a thermally conductive dielectric coolant. Examples of such coolants include mineral oil, synthetic oil, hydrocarbon fluid, or the like.

The primary circuit board 104 is disposed within and coupled to the base 120 of the chassis 102 (directly, or via an intermediate structure such as the tub described above). In one or more examples, at least part of the primary circuit board 104 is disposed in the coolant pool 112 and immersed in the coolant 125. In particular, a level of the coolant 125 in the coolant pool 112 may be high enough to cover at least part of the primary circuit board 104 and electronic elements (e.g., resistors, capacitors, or the like) disposed on and coupled to a top side of the primary circuit board 104. For example, in some implementations the entirety of the primary circuit board 104 is disposed in the coolant pool 112 excluding any portions that may be contained within cooling containers 108 (described below). In some examples, the primary circuit board 104 may be a motherboard of the electronic device 100.

The electronic components 106 are disposed within the chassis 102. In some examples, the electronic components 106 may occupy some portions of the internal volume 124 of the chassis 102, when disposed within the chassis 102. In certain examples, the electronic components 106 includes components of the electronic device 100 such as one or more central processing units (CPUs 126), one or more memory modules 128 (e.g., DIMMS), one or more storage devices 130 (e.g., solid state drives), one or more expansion cards 132 (e.g., PCIe cards), one or more network cards 134 (OCP cards), one or more power supply units 136, and the like. In some examples, some of the electronic components 106 are coupled to the primary circuitry board 104 while other electronic components 106 are not. For example, the storage devices 130 or other electronic components may be coupled to another circuit board 131 (often called a backplane, midplane, or mezzanine). In some examples, the electronic components 106 may be grouped into a first subset 106-1 of the plurality of electronic components 106 and a second subset 106-2 of the plurality of electronic components 106. In some examples, the first subset 106-1 includes the electronic components 106 that are mounted on the primary circuit board 104 while the second subset 106-2 includes the electronic components 106 not mounted on the primary circuit board 104. In certain examples, the first subset 106-1 includes the one or more CPUs 126, the one or more memory modules 128, the one or more expansion cards 132, and the one or more network cards 134. In certain examples, the second subset 106-2 includes the one or more storage devices 130 and the one or more power supply units 136. For example, the one or more storage devices 130 and the one or more power supply units 136 are mounted on and coupled to the base 120 (directly, or via an intermediate structure, such as circuit board 131). Even though in the example of FIGS. 1A-1C, the one or more storage devices 130 and the one or more power supply units 136 are shown to be disposed on the base 120 of the chassis 100, in some other examples, the one or more storage devices 130 and the one or more power supply units 136 may be mounted on the primary circuit board 104. In some examples, the electronic device 100 further includes one or more external communication ports 138 (e.g., USB ports, network ports, or the like), which are mounted to one of the panels, e.g., the rear panel 118 of the chassis 102. In particular, the one or more external communication ports 138 may be coupled to yet another circuit board 139, which may be coupled to the printed circuit board 104 via cables (not shown), for example. In certain examples, each of the one or more external communication ports 138 is disposed at a height that is greater than a level of the coolant 125 in the coolant pool 112 to prevent leakage of the coolant 125 through the one or more external communication ports 138.

The plurality of cooling containers 108 is disposed within the chassis 102 such that each cooling container among the plurality of cooling containers 108 contains at least one electronic component among the plurality of electronic components 106. In some examples, the cooling containers 108 may also occupy some portions of the internal volume 124 of the chassis 102, when disposed within the chassis 102.

In certain examples, the cooling containers 108 includes multiple different types of cooling containers 108 that have different shapes and/or sizes and that may enclose different components 106. Some of the cooling containers 108 may include lateral walls coupled to the primary circuit board 104, with a portion of the primary circuit board 104 forming the bottom bound of the cooling container. Other cooling containers 108 may include lateral walls coupled to the bottom 120 of the chassis 102 (or to an intermediate structure, such as a tub), with the bottom 120 (or intermediate structure) forming the bottom bound of the cooling container. Each cooling container 108 may include at least one inlet and at least one outlet, wherein coolant flows into the cooling container 108 via the inlet and out of the cooling container via the outlet. In some examples, the outlet of one cooling container 108 forms the inlet of another cooling container 108. In some cases, the inlet/outlet may include an aperture or guide feature, such as a port, a valve, a chute, a pipe, etc., while in other cases the outlet may be a top of a wall of the cooling container 108 (e.g., the coolant leaves the cooling container 108 by overflowing the wall) and the inlet of the cooling container 108 may be a top opening of the cooling container 108. At least one of the cooling containers 108 may be configured to receive the coolant from a coolant loop, described in greater detail below. In some examples, one or more of the cooling containers 108 are configured to receive coolant from the outlet of another one of the cooling container 108.

For example, in the implementation illustrated in FIGS. 1A-1C, the cooling containers 107 include a plurality of first cooling containers 140, a plurality of second cooling containers 142, a third cooling container 144, a fourth cooling container 146, and a fifth cooling container 148. In some examples, the plurality of cooling containers 108 may be grouped into a first set of cooling containers 108-1 and a second set of cooling containers 108-2. In the example of FIGS. 1A-1C, the first set of cooling containers 108-1 includes the plurality of first cooling containers 140, the plurality of second cooling containers 142, and the third cooling container 144. Similarly, the second set of cooling containers 108-2 includes the fourth cooling container 146 and the fifth cooling container 148. In some examples, each of the first set of cooling containers 108-1 is disposed on the primary circuit board 104 and contains at least one electronic component of the first subset 106-1 of the plurality of electronic components 106. For example, the plurality of first cooling containers 140 contains the one or more CPUs 126, the plurality of second cooling containers 142 contains the one or more memory modules 128, and the third cooling container 144 contains the one or more expansion cards 132 and the one or more network cards 134. Further, each cooling container among the second set of cooling containers 108-2 is not disposed on the primary circuit board 104 and contains at least one electronic component of the second subset 106-2 of the plurality of electronic components 106. In particular, each cooling container among the second set of cooling containers 108-2 is disposed on the base 120 and contains the at least one electronic component of the second subset 106-2. For example, the fourth cooling container 146 is disposed on and coupled to the base 120 such that the fourth cooling container 146 contains the one or more storage devices 130. Similarly, the fifth cooling container 148 is disposed on and coupled to the base 120 such that the fifth cooling container 148 contains the one or more power supply units 136.

In certain examples, the plurality of first cooling containers 140 includes a first cooling container 140A and another first cooling container 140B. In such examples, the first cooling container 140A includes an inlet e.g., a first inlet 150A, and one or more outlets e.g., a first outlet 152A, and a second outlet 152B. Similarly, the other first cooling container 140B includes another inlet e.g., a second inlet 150B, and one or more outlets e.g., a third outlet 152C and fourth outlet 152D. In certain examples, the plurality of second cooling containers 142 includes a second cooling container 142A, another second cooling container 142B, and yet another second cooling container 142C. In such examples, the second cooling container 142A includes a fifth outlet 154A. However, the first outlet 152A of the first cooling container 140A may function as an inlet of the second cooling container 142A. Similarly, the other second cooling container 142B includes a sixth outlet 154B and a seventh outlet 154C. However, the second outlet 152B of the first cooling container 140A and the third outlet 152C of the other first cooling container 140B function as inlets of the second cooling container 142B. Further, the other second cooling container 142C includes an eight outlet 154D. However, the fourth outlet 152D of the other first cooling container 140B functions as an inlet of the second cooling container 142C. In certain examples, the third cooling container 144 includes a third inlet 156 and one or more outlets e.g., a ninth outlet 158A, a tenth outlet 158B, and an eleventh outlet 158C. In certain examples, the fourth cooling container 146 includes a fourth inlet 160 and one or more outlets e.g., a twelfth outlet 162A, a thirteenth outlet 162B, and a fourteenth outlet 162C. In certain examples, the fifth cooling container 148 includes a fifth inlet 164 and one or more outlets e.g., a fifteenth outlet 166A and a sixteenth outlet 166B. In one or more examples, each of the first outlet 152A, the second outlet 152B, the third outlet 152C, and the fourth outlet 152D is configured to overflow the coolant 125 into a corresponding second cooling container 142A, 142B, and 142C. However, each of the fifth outlet 154A, the sixth outlet 154B, the seventh outlet 154C, the eight outlet 154D, the ninth outlet 158A, the tenth outlet 158B, the eleventh outlet 158C, the twelfth outlet 162A, the thirteenth outlet 162B, the fourteenth outlet 162C, the fifteenth outlet 166A, and the sixteenth outlet 166B is configured to overflow the coolant 125 into the coolant pool 112 of the chassis 102. Even though not illustrated, in some other examples, each of the plurality of second cooling containers 142 may be separately coupled to the manifold 178 via one or more pipes, instead of fluidically coupled to one of the first containers 140 to receive the coolant 125 overflowing from the corresponding first container 140. In such examples, each of the first cooling containers 140 may also overflow the coolant 125 directly to the coolant pool 112 instead of overflowing the coolant 125 to the second container 142.

The heights of each cooling container 108 may be configured based on the dimension so the components 106 enclosed thereby so that the coolant level in the cooling container is sufficiently height to cover at least the portions of the component 106 that need cooling (which may include the entirety of the component 106 in some cases, or may include only a portion of the component 106 in other cases). Because the various components may have different heights, the cooling containers 108 too may have different heights and different coolant levels therein. In one or more examples, each of the plurality of cooling containers 108 has a height greater than a height of a corresponding electronic component 106, so as to allow each cooling container 108 to immerse the corresponding electronic component 106 in the coolant 125 filled within the corresponding cooling container 108. In other examples, portions of some of the components 106 may protrude above the level of the coolant 125, such as handles or other portions that do not need direct cooling. In some examples, at least the electrically active portions of the electronic component 106 may be covered by the coolant 125. Further, at least one cooling container among the plurality of cooling containers 108 has a height that is different than at least one other cooling container among the plurality of cooling containers 108. In other words, the height of each cooling container 108 is defined to be greater than that of the height of the corresponding electronic component 106. In particular, referring to FIG. 1B, the third cooling container 144 has the height which is greater than the height of each cooling container of the one or more first cooling containers 140 and the height of the fourth cooling container 146. Further, the third cooling container 144 has a height which is greater than the height of the one or more expansion cards 132 and the one or more network cards 134. Similarly, referring to FIG. 1C, each cooling container of the one or more second cooling containers 142 has the height which is smaller than the height of a corresponding cooling container of the one or more first cooling containers 140. Further, the second cooling container 142 has a height which is greater than the height of the one or more memory modules 128. Similarly, the fifth cooling container 148 has a height which is greater than the height of a corresponding cooling container of the one or more second cooling containers 142. Further, the fifth cooling container 148 has a height which is greater than the height of the one or more power supply units 136.

The one or more cooling containers 108 among the first set of cooling containers 108-2 are disposed on the primary circuit board 104. In some examples, each cooling container 108 among the first set of cooling containers 108-1 has vertical wall portions 168 defining lateral bounds of the cooling container 108. In such examples, the vertical wall portions 168 are sealed liquid tight to the primary circuit board 104 such that the primary circuit board 104 defines a bottom bound of the cooling container 108. The first cooling container 140 has first vertical wall portions 168A, which are sealed liquid tight to the primary circuit board 104. In such examples, the first vertical wall portions 168A define the lateral bounds and a portion of the primary circuit board 104 that is configured to mount the one or more CPUs 126 to the primary circuit board 104 defines the bottom bound of the first cooling container 140. Accordingly, the first vertical wall portions 168A and the portion of the primary circuit board 104 are sealed liquid tight to hold the coolant 125 filled within the first cooling container 140 and prevent leakage of the coolant 125 from the first cooling container 140 to the coolant pool 112 via the primary circuit board 104. The second cooling container 142 has second vertical wall portions 168B, which are sealed liquid tight to the primary circuit board 104. In such examples, the second vertical wall portions 168B define the lateral bounds and a portion of the primary circuit board 104 that is configured to mount the one or more memory modules 128 to the primary circuit board 104 define the bottom bound of the second cooling container 142. Accordingly, the first vertical wall portions 168B and the portion of the primary circuit board 104 are sealed liquid tight to hold the coolant 125 filled within the second cooling container 142 and prevent leakage of the coolant 125 from the second cooling container 142 to the coolant pool 112 via the primary circuit board 104. The third cooling container 144 has third vertical wall portions 168C, which are sealed liquid tight to the primary circuit board 104 (directly through a portion of the primary circuit board 104 and through a horizontal wall portions 168D). In such examples, the third vertical wall portions 168C define the lateral bounds and the horizontal wall portion 168D and the portion of the primary circuit board 104 define the bottom bounds of the third cooling container 144. Accordingly, the third vertical wall portions 168C, the portion of the primary circuit board 104, and the horizontal wall portion 168D are sealed liquid tight to hold the coolant 125 filled within the third cooling container 144 and prevent leakage of the coolant 125 from the third cooling container 144 to the coolant pool 112 via the primary circuit board 104. Even though each of the first cooling container 140, the second cooling container 142, and the third cooling container 144 is shown to have lower bounds sealed liquid tight to the primary circuit board 104 to the hold the coolant 125 filled within the corresponding container, in some other examples, each of the first cooling container 140, the second cooling container 142, and the third cooling container 144 may have the lower bounds not sealed liquid tight to the primary circuit board 104, thereby allowing a portion of the coolant 125 to leak therethrough from the corresponding container to the coolant pool 112. In such examples, the supply of the coolant 125 to the corresponding container may be maintained at a higher rate than the leakage rate of the coolant 125 to maintain sufficient amount of coolant 125 in the corresponding container or prevent draining out of the corresponding container. In some other examples, the lower bounds of each of each of the first cooling container 140, the second cooling container 142, and the third cooling container 144 may be coupled to the base 120 of the chassis 102.

The one or more cooling containers 108 among the second set of cooling containers 108-2 are disposed on the base 120 of the chassis 102. In particular, the fourth cooling container 146 is disposed on the base 120 such that the fourth cooling container 146 contains the one or more storage devices 130. Further, the fourth cooling container 146 may be coupled to the base 120. Similarly, the fifth cooling container 148 is disposed on the base 120 such that the fifth cooling container 148 contains the one or more power supply units 136. Further, the fifth cooling container 148 may be coupled to the base 120.

In one or more examples, the coolant loop 110 is configured to circulate the coolant 125 from the coolant pool 112 to the plurality of cooling containers 108. In some examples, the coolant loop 110 includes a coolant collector 170, one or more circulation pipes 172, a heat exchanger 174, a pump 176, a manifold 178, and one or more distribution pipes e.g., pipes 180.

The coolant collector 170 (as shown in FIG. 1A) is disposed within the coolant pool 112. The coolant collector 170 may be disposed such that an opening therein through which coolant 125 enters the coolant collector 170 is at a lower height than the coolant level (i.e., the top surface of the coolant) in the coolant pool 112 to allow the coolant collector 170 to collect the coolant 125 from the coolant pool 112 and supply the collected coolant 125 to the heat exchanger 174. The heat exchanger 174 is fluidically connected to the coolant collector 170 and the pump 176 via the one or more circulation pipes 172. The heat exchanger 174 is further fluidically connected to a facility water (not shown) via an inlet tube 184 and an outlet tube 186. In some examples, the heat exchanger 174 is an indirect heat exchanger, which may receive the relatively warm coolant 125 from the coolant collector 170 via one of the one or more circulation pipes 172 and relatively cool facility liquid 182 from the inlet tube 184. Further, the heat exchanger 174 may transfer heat from the coolant 125 into the facility liquid 182, thus cooling the coolant 125 and warming the facility liquid 182. Later, the heat exchanger 174 may output the now-cooled coolant 125 via another circulation pipe 172 of the one or more circulation pipes 172 and output the now-warmed facility liquid 182 via the outlet tube 186. The cooled coolant 125 is then supplied to the cooling containers 108 via the remainder of the coolant loop 110. The pump 176 generates the pressure which causes the coolant 125 to flow in this manner.

In the illustrated example, the pump 176 is located downstream of the heat exchanger 174 and upstream of the manifold 178. In particular, in the illustrated example, the pump 176 is fluidically connected to the heat exchanger 174 via the circulation pipe 172 to which the heat exchanger 174 outputs the cooled coolant 125. The pump 176 is further fluidically connected to the manifold 178 via yet another circulation pipe 172 of the one or more circulation pipes 172. The pump 176 drives the coolant 125 to flow from the heat exchanger 174 to the manifold 178. In other examples the pump 176 is located in other positions in the loop 110. For example, the pump 176 may be upstream of the heat exchanger 174 (e.g., between the heat exchanger 174 and the coolant collector 170).

The manifold 178 is fluidically connected to at least one of the cooling containers 108 via at least one pipe 180 to distribute the coolant 125 to the plurality of cooling containers 108. In some examples, the manifold 178 is fluidically connected to multiple cooling containers 108 via multiple pipes 180. In some examples, one or more cooling containers 108 are not directly coupled to the manifold 178 via pipes 180, and instead such cooling containers 108 may receive an inflow of coolant 125 from another one of the cooling container 108 (i.e., an outflow of coolant 125 from one cooling container 108 becomes the inflow of coolant 125 to another cooling container 108).

In some examples, the plurality of pipes 180 includes a first pipe 180A, a second pipe 180B, a third pipe 180C, a fourth pipe 180D, and a fifth pipe 180E. In one or more examples, the first pipe 180A extends from the manifold 178 and connects to the first inlet 150A of the first cooling container 140A. Similarly, the second pipe 180B extends from the manifold 178 and connects to the second inlet 150B of the other first cooling container 140B. The third pipe 180C extends from the manifold 178 and connects to the third inlet 156 of the third cooling container 144. The fourth pipe 180D extends from the manifold 178 and connects to the fourth inlet 160 of the fourth cooling container 146. Further, the fifth pipe 180E extends from the manifold 178 and connects to the fifth inlet 164 of the fifth cooling container 148. In some examples, respective diameters of the plurality of pipes 180 vary depending on the respective cooling container size and levels of the coolant 125 in corresponding cooling containers 108 to which the plurality of pipes 180 are connected, respectively, among the one or more cooling containers 108. In particular, each of the first pipe 180A and the second pipe 180B has diameter which may be greater than the diameter of the third pipe 180C, the fourth pipe 180D, and the fifth pipe 180E to allow the coolant 125 to fill in the corresponding cooling container 108, when the pump 176 is operating at a constant flow rate.

In one or more examples, the first cooling container 140A includes the first inlet 150A fluidically coupled to the coolant loop 110 to receive an inflow of a first portion 125A of the coolant 125 from the coolant loop 110. Similarly, the other first cooling container 140B includes the second inlet 150B fluidically coupled to the coolant loop 110 to receive the inflow of a second portion 125B of the coolant 125 from the coolant loop 110. The third cooling container 144 includes the third inlet 156 fluidically coupled to the coolant loop 110 to receive the inflow of a third portion 125C of the coolant 125 from the coolant loop 110. The fourth cooling container 146 includes the fourth inlet 160 fluidically coupled to the coolant loop 110 to receive the inflow of a fourth portion 125D of the coolant 125 from the coolant loop 110. Finally, fifth cooling container 148 includes the fifth inlet 164 fluidically coupled to the coolant loop 110 to receive the inflow of a fifth portion 125E of the coolant 125 from the coolant loop 110. In such examples, the second cooling container 142A is configured to receive a part of the outflow of the coolant 125 overflowing from the first cooling container 140A as the inflow of the coolant 125 of the second cooling container 142A. In such examples, the other second cooling container 142B is configured to receive another part of the outflow of the coolant 125 overflowing from the first cooling container 140A as the inflow of the coolant 125 of the other second cooling container 142B. Similarly, the other second cooling container 142C is configured to receive a part of the outflow of the coolant 125 overflowing from the other first cooling container 140B as the inflow of the coolant 125 of the other second cooling container 142C. In such examples, the other second cooling container 142B is configured to receive yet another part of the outflow of the coolant 125 overflowing from the other first cooling container 140B as the inflow of the coolant 125 of the other second cooling container 142B. Further, the outflow of the coolant from each of the second cooling containers 142A, 142B, 142C overflows into the coolant pool 112 in the chassis 102. Similarly, the outflow of the coolant from each of the third cooling container 144, the fourth cooling container 146, and the fifth cooling container 148 overflows into the coolant pool 112 in the chassis 102.

During operation of the electronic device 100, in certain examples, the pump 176 may operate at a constant flow rate. In such examples, the pump 176 may draw the coolant 125 from the coolant collector 170 into the manifold 178 via the heat exchanger 174. In particular, when the pump 176 drives the coolant 125 from the coolant collector 170, the coolant 125 may first flow through the heat exchanger 174, where the heat exchanger 174 may use the facility liquid 182 to indirectly remove heat from the coolant 125. Further, the coolant 125 may flow from the heat exchanger 174 to the manifold 178.

In some examples, the manifold 178 may split the coolant 125 into multiple portions. In such examples, the first cooling container 140A may receive the inflow of the first portion 125A of the coolant 125 from the manifold 178. The first portion 125A of the coolant 125 may raise up to the height of the first outlet 152A of the first cooling container 140A and remove heat from the one or more CPUs 126. The second cooling container 142A may receive a part $125A_1$ of the outflow of the coolant 125 overflowing from the first cooling container 140A as the inflow of the coolant 125 of the second cooling container 142A. The part $125A_1$ of the coolant 125 may raise up to the height of the fifth outlet 154A of the second cooling container 142A and remove heat from the one or more memory modules 128. Further, the outflow of the part $125A_1$ of the coolant 125 of the second cooling container 142A may overflow through the fifth outlet 154A into the coolant pool 112 in the chassis 102.

Similarly, the other first cooling container 140B may receive the inflow of the second portion 125B of the coolant 125 from the manifold 178. The second portion 125B of the coolant 125 may raise up to the height of the fourth outlet 152D of the second cooling container 140B and remove heat from the one or more CPUs 126. The second cooling container 142C may receive a part $125B_1$ of the outflow of the coolant 125 overflowing from the first cooling container 140B as the inflow of the coolant 125 of the second cooling container 142C. The part $125B_1$ of the coolant 125 may raise up to the height of the eight outlet 154D of the second cooling container 142C and remove heat from the one or more memory modules 128. Further, the outflow of the part $125B_1$ of the coolant 125 of the second cooling container 142C may overflow through the eight outlet 154D into the coolant pool 112 in the chassis 102.

In one or more examples, the second cooling container 142B may receive other parts $125A_2$, $125B_2$ of the coolant 125 from the first cooling container 140A and the other first cooling container 140B. The other parts 125A$_2$, 125B$_2$ of the coolant 125 may raise up to the height of the sixth outlet 154B and the seventh outlet 154C of the second cooling container 142B and remove heat from the one or more memory modules 128. Further, the outflow of the other parts 125A$_2$, B$_2$ of the coolant 125 of the second cooling container 142B may overflow through the sixth outlet 154B and the seventh outlet 154C into the coolant pool 112 in the chassis 102. In other words, the outflow of the coolant 125 of the second cooling container overflows into the coolant pool 112 in the chassis 102.

The third cooling container 144 may receive the third portion 125C of the coolant 125 from the manifold 178. The third portion 125C of the coolant 125 may raise up to the height of the ninth outlet 158A, the tenth outlet 158B and the eleventh outlet 158C of the third cooling container 144 and remove heat from the one or more expansion cards 132 and the one or more network cards 134. Further, the outflow of the third portion 125C of the coolant 125 of the third cooling container 144 may overflow through the ninth outlet 158A, the tenth outlet 158B and the eleventh outlet 158C into the coolant pool 112 in the chassis 102. The fourth cooling container 146 may receive the fourth portion 125D of the coolant 125 from the manifold 178. The fourth portion 125D of the coolant 125 may raise up to the height of the twelfth outlet 162A, the thirteenth outlet 162B, and the fourteenth outlet 162C of the fourth cooling container 146 and remove heat from the one or more storage devices 130. Further, the outflow of the fourth portion 125D of the coolant 125 of the fourth cooling container 146 may overflow through the twelfth outlet 162A, the thirteenth outlet 162B, and the fourteenth outlet 162C of into the coolant pool 112 in the chassis 102. The fifth cooling container 148 may receive the fifth portion 125E of the coolant 125 from the manifold 178. The fifth portion 125E of the coolant 125 may raise to the height of the fifteenth outlet 166A and the sixteenth outlet 166B of the fifth cooling container 148 and remove heat from the one or more power supply units 136. Further, the outflow of the fifth portion 125E of the coolant 125 of the fifth cooling container 148 may overflow through the fifteenth outlet 166A and the sixteenth outlet 166B into the coolant pool 112 in the chassis 102. In one or more examples, the coolant 125 (e.g., 125A$_1$, 125B$_1$, 125A$_2$B$_2$, 125C, 125D, 125E) in the coolant pool 112 may remove heat from the primary circuit board 104 and flow into the coolant collector 170. The pump may drive the coolant 125 in the coolant collector 170 to the manifold 178 via the heat exchanger 174 and the process of recirculating the coolant 125 may continue as discussed herein.

Figure 2:
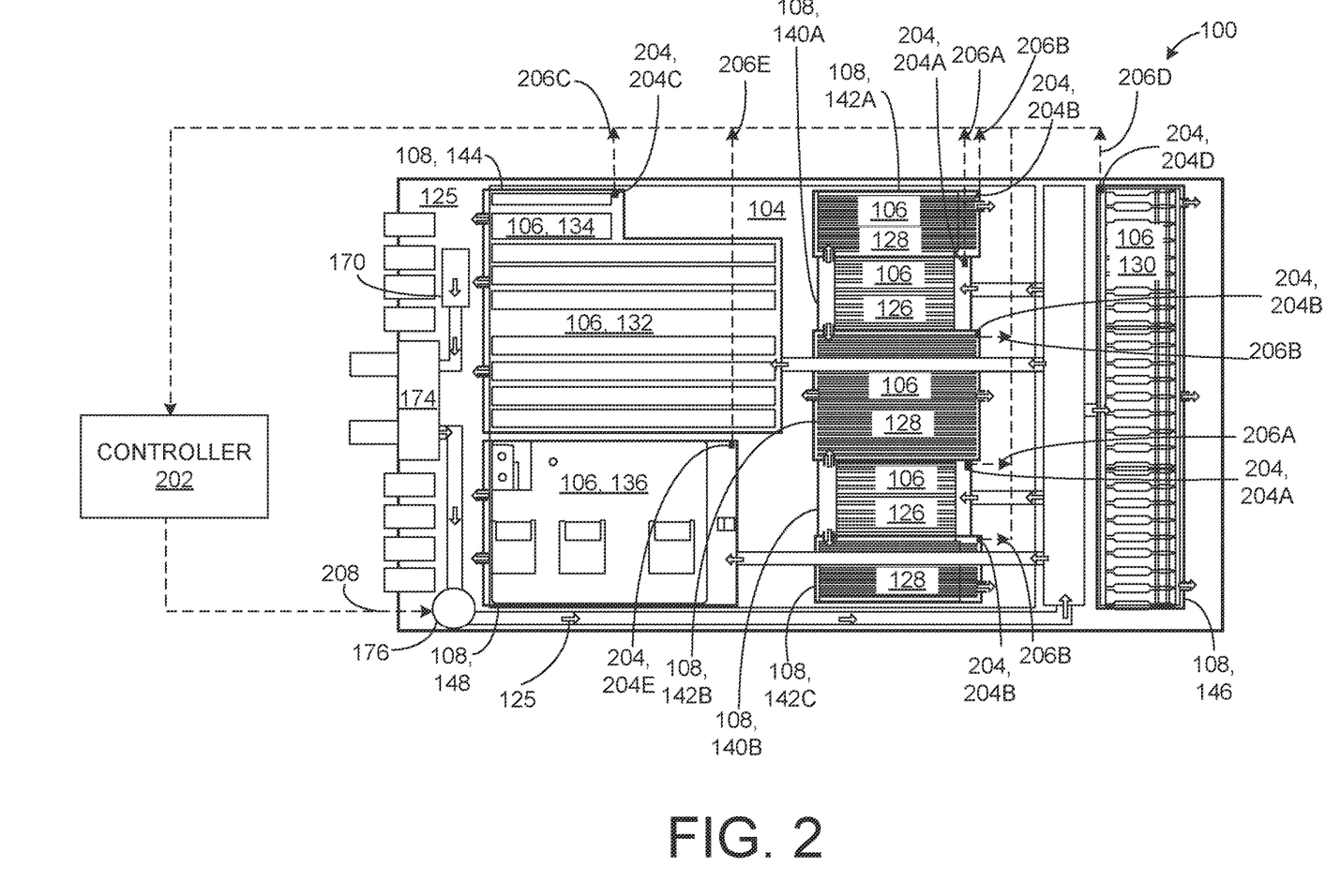
FIG. 2 illustrates the electronic device 100 of FIG. 1A having a controller and a plurality of sensors according to the example of the present disclosure.

FIG. 2 depicts a top view of one implementation example of the electronic device 100 of FIGS. 1A-1C having a controller 202 and a plurality of sensors 204. In some examples, each of the plurality of sensors 204 is a temperature sensor disposed within a respective cooling container of a plurality of cooling containers 108. In particular, each of the plurality of sensors 204 is disposed such that it contacts the coolant 125 filled in the respective cooling container and detects the temperature of the coolant 125 filled in that cooling container 108. The plurality of sensors 204 includes a plurality of first sensors 204A, a plurality of second sensors 204B, a third sensor 204C, a fourth sensor 204D, and a fifth sensor 204E. In such examples, one sensor among the plurality of first sensors 204A is disposed in the first cooling container 140A and another sensor among the plurality of first sensors 204A is disposed in the other first cooling container 140B. Similarly, one sensor among the plurality of second sensors 206B is disposed in the second cooling container 142A, another sensor among the plurality of second sensors 204B is disposed in the other second cooling container 142B, and yet another sensor among the plurality of second sensors 204B is disposed in the other second cooling container 142C. The third sensor 204C is disposed in the third cooling container 144, the fourth sensor 204D is disposed in the fourth cooling container 146, and the fifth sensor 204E is disposed in the fifth cooling container 148. Further, each of the plurality of sensors 206 is communicatively coupled to the controller 202. For example, each of the plurality of first sensors 204A is communicatively coupled to the controller 202 via a respective first input signal 206A. Similarly, each of the plurality of second sensors 204B is communicatively coupled to the controller 202 via a respective second input signal 206B. The third sensor 204C is communicatively coupled to the controller 202 via a third input signal 206C. The fourth sensor 204D is communicatively coupled to the controller 202 via a fourth input signal 206D. The fifth sensor 204E is communicatively coupled to the controller 202 via a fifth input signal 206E.

In some examples, the controller 202 may be hosted in the electronic device 100. In some other examples, the controller 202 is deployed in outside of the electronic device 100. The controller 202 may have memory to store a threshold temperature data corresponding to each of the plurality of electronic components 106. For example, the threshold temperature data may include a first threshold temperature data corresponding to the one or more CPUs 126, a second threshold temperature data corresponding to the one or more memory modules 128, a third threshold temperature data corresponding to the one or more expansion cards 132 and the one or more network cards 134, a fourth threshold temperature data corresponding to the one or more storage devices 130, and a fifth threshold temperature data corresponding to the one or more power supply units 136. In one or more examples, the threshold temperature data may be a temperature data indicative of a maximum temperature up to which a corresponding electronic component 106 may operate without deteriorating a performance of the corresponding electronic component 106. The controller 202 may be communicatively coupled to the pump 176 via a control signal 208. In such examples, the pump 176 is an active pump, which may be regulated to vary a flow rate of the coolant 125 based on the control signal 208 received from the controller 202.

During operation, each of the plurality of sensors 204 may periodically (e.g., at a time interval of about 30 seconds, for example) detect the temperature of the corresponding electronic component 106 by sensing the temperature of the coolant 125 filled in the corresponding cooling container 108. In other words, each sensor detects temperature of the coolant 125 in the corresponding cooling container 108. Further, each of the plurality of sensors 204 may send a detected temperature data of each of the plurality of electronic components 106 via the corresponding input signal (206A, 206B, 206C, 206D, 206E) to the controller 202. In such examples, the controller 202 may receive the detected temperature data of each of the plurality of electronic components 106 and compare the detected temperature data with a corresponding threshold temperature data of each of the plurality of electronic components 106. In some examples, when the controller 202 determines that the detected temperature data of one of the plurality of electronic components 106 is greater than the corresponding threshold temperature data, the controller 202 sends the control signal 208 to the pump 176 to vary (e.g., increase) the flow rate of the coolant 125 to the plurality of cooling container 108. In other words, the controller 202 generates the control signal 208 to the pump 176 based on a comparison of the detected temperature data with the threshold temperature data. In such examples, the pump 176 drives the coolant 125 to the plurality of cooling containers 108 at a varied flow rate based on the control signal 208 received from the controller 202.

Figure 3:
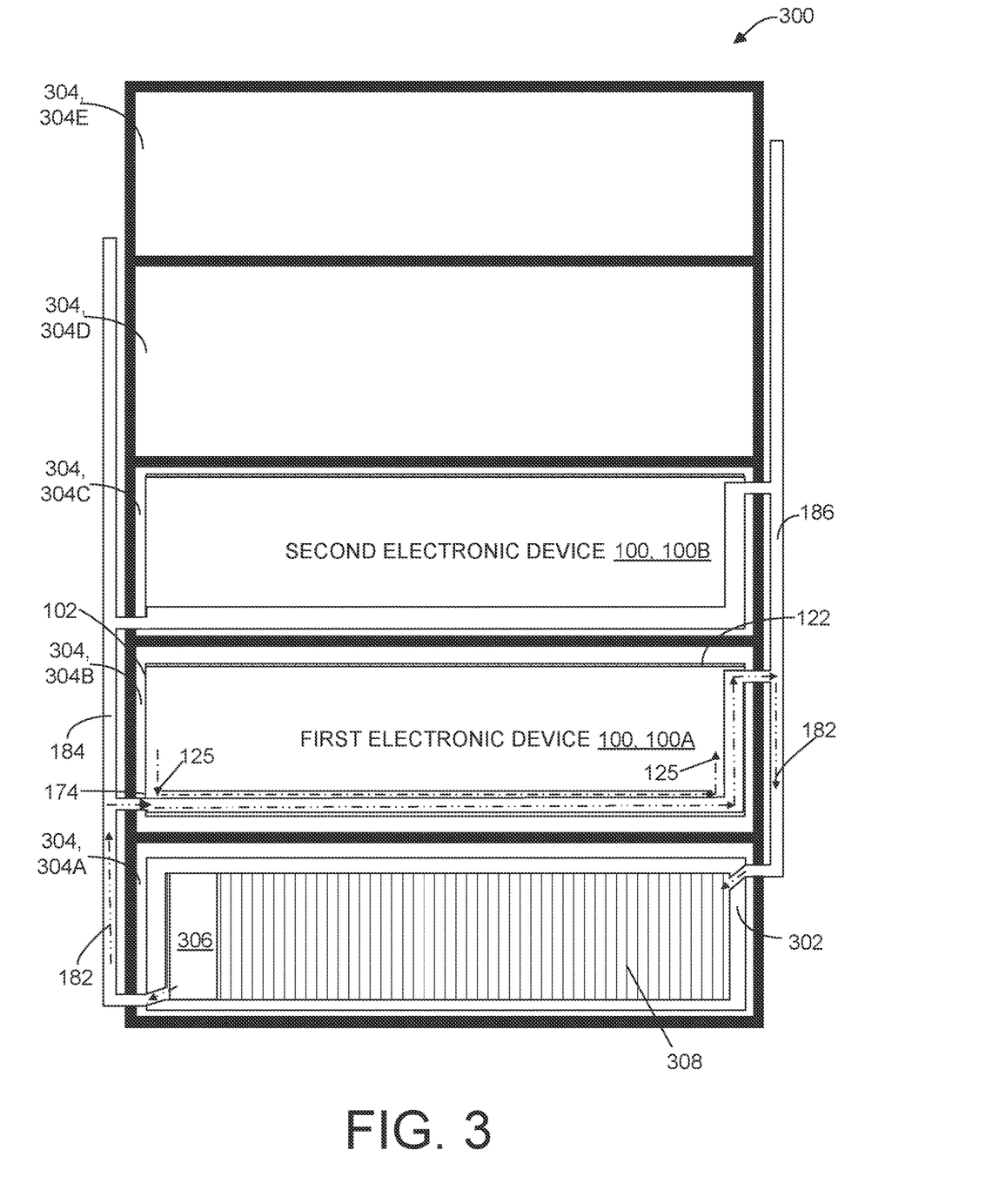
FIG. 3 illustrates a block diagram of a rack having an electronic device of FIGS. 1A-1C and a facility liquid supply unit according to an example of the present disclosure.

FIG. 3 depicts a block diagram of a rack 300 having an electronic device 100 of FIGS. 1A-1C and a facility liquid supply unit 302. It should be understood that each of the FIG. 3 is not intended to illustrate specific shapes, dimensions, or other structural details accurately or to scale, and that implementations of the rack 300 may have different numbers and arrangements of the illustrated components and may also include other parts that are not illustrated. The rack 300 includes a facility liquid supply unit 302, a plurality of enclosures 304, and one or more electronic devices 100. In some examples, the rack 300 may be a vertically extending cabinet having at least a 42 Unit (U) height, 22 U height, 36 U height, or the like.

The plurality of enclosures 304 includes a first enclosure 304A, a second enclosure 304B, a third enclosure 304C, a fourth enclosure 304D, and a fifth enclosure 304E located vertically spaced apart from each other. In some examples, the facility liquid supply unit 302 is a coolant distribution unit. In some examples, the facility liquid supply unit 302 is disposed in the first enclosure 304A among the plurality of enclosures 304. The facility liquid supply unit 302 includes an inlet tube 184 and an outlet tube 186. The inlet tube 184 may be configured to connect to an inlet side of a heat exchanger 174 of each of the one or more electronic devices 100. Similarly, the outlet tube 186 may be configured to connect to an outlet side of the heat exchanger 174 of each of the one or more electronic devices 100. The inlet tube 184 may supply the facility liquid (e.g., cool facility liquid) to the inlet side of the heat exchanger 174 and the outlet tube 186 may receive the facility liquid 182 (e.g., a hot facility liquid) from the outlet side of the heat exchanger 174. In such examples, the facility liquid supply unit 302 may further include a facility pump 306 and a heat dissipater 308 coupled to the inlet tube 184 and the outlet tube 186. The heat dissipater 308 may receive the facility liquid 182 from the outlet tube, remove heat from the facility liquid 182, and supply the facility liquid 182 to the facility pump 306. In such examples, the facility pump 306 may drive the facility liquid 182 to the heat exchanger 174 of each of the one or more electronic device 100.

The one or more electronic devices 100 includes a first electronic device 100A and a second electronic device 100B. Each of the one or more electronic devices 100 e.g., the first electronic device 100A may have a removable top lid 122 disposed on and coupled to the chassis 102. The first electronic device 100A is disposed in the second enclosure 304B and the second electronic device 100B is disposed in the third enclosure 304C. The fourth and fifth enclosures 304D, 304E are shown empty in the example of FIG. 3. Each of the first and second electronic devices 100A, 100B is similar to the electronic device 100 discussed in the example of FIGS. 1A-1C, therefore, each of the first and second electronic devices 100A, 100B is not discussed herein for brevity of the disclosure. In one or more examples, each of the one or more electronic devices 100 may be slidably inserted into the corresponding enclosure 304 of the rack 300. In such examples, in a state of the electronic device, e.g., the first electronic device 100A being partially pulled out from the second enclosure 304B, the removable top lid 122 may provide access to the plurality of electronic components 106 (as shown in FIGS. 1A-1C) disposed within the chassis 102 for performing a service or maintenance event.

In some examples, the heat exchanger 174 of the first electronic device 100A and the second electronic device (not shown) is disposed in a thermal contact with the inlet tube 184 and the outlet tube 186 of the facility liquid supply unit 302. The heat exchanger 174 is configured to remove heat from the coolant 125 by indirectly exchanging heat between the facility liquid 182 and the coolant 125. In such examples, the pump (not shown) of the one or more electronic devices 100 drives the coolant 125 to the plurality of cooling containers 108 (as shown and discussed in the example of FIGS. 1A-1C and 3). Further, the facility liquid 182 (e.g., hot facility liquid) is driven to the outlet tube 186 of the facility liquid supply unit 302.

Figure 4:
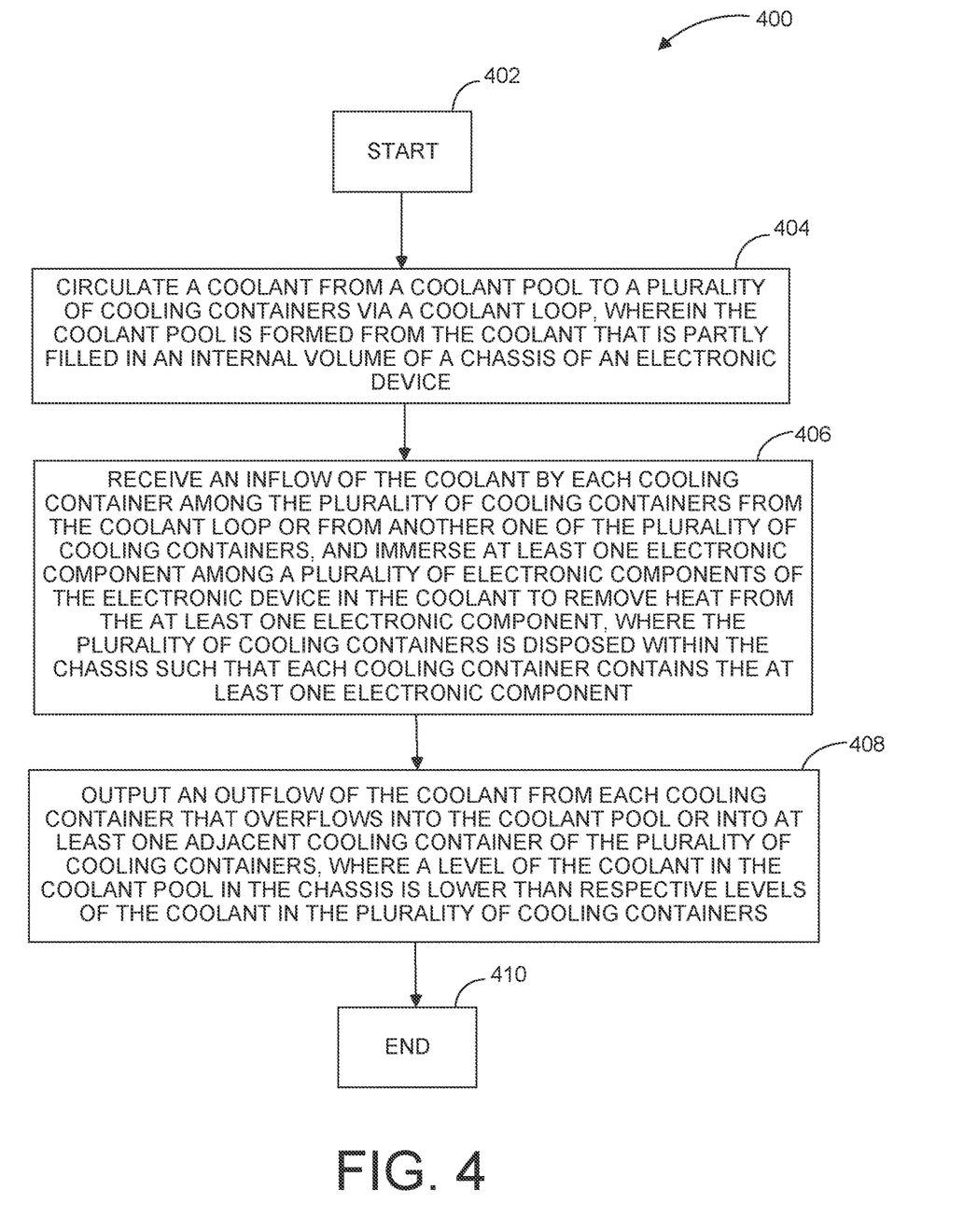
FIG. 4 is a flowchart depicting a method of cooling a plurality of electronic components and a primary circuit board of an electronic device according to one example of the present disclosure.

FIG. 4 depicts a flowchart depicting a method 400 of immersion cooling an electronic device. It may be noted herein that the method 400 is described in conjunction with FIGS. 1A-1C, and 3 for example. The method 400 starts at block 402 and continues to block 404.

At block 404, the method 400 includes circulating a coolant from a coolant pool to a plurality of cooling containers via a coolant loop. In some examples, the coolant pool is formed from the coolant that is partly filled in an internal volume of a chassis of an electronic device. The coolant loop includes a pump, which is configured to drive the coolant from a coolant collector to the plurality of cooling containers via a heat exchanger, a manifold, and a corresponding pipe connected to the manifold. In some examples, the heat exchanger removes heat from the coolant and the pump outputs the coolant to the manifold. The method 400 continues to block 406.

At block 406, the method 400 includes receiving an inflow of the coolant by each cooling container among the plurality of cooling containers from the coolant loop or from another one of the plurality of cooling containers, and immerse at least one electronic component among a plurality of electronic components of the electronic device in the coolant to remove heat from the at least one electronic component, wherein the plurality of cooling containers is disposed within the chassis such that each cooling container contains the at least one electronic component. In some examples, the manifold bifurcates the coolant received from the pump into multiple portions. In such examples, some of the plurality of cooling containers may directly receive a portion of coolant among the multiple portions of coolant from the manifold. However, some adjacent cooling containers may receive the coolant from some of the plurality of cooling containers. In particular, the coolant from some of the plurality of cooling containers may overflow into some adjacent cooling containers. The method 400 continues to block 408.

At block 408, the method 400 includes outputting an outflow of the coolant from each cooling container that overflows into the coolant pool or into at least one adjacent cooling container of the plurality of cooling containers, wherein a level of the coolant in the coolant pool in the chassis is lower than respective levels of the coolant in the plurality of cooling containers. In some examples, some of the plurality of cooling containers may overflow the coolant into the coolant pool. However, some other cooling containers of the plurality of cooling containers may overflow the coolant into the adjacent cooling containers. The coolant in such adjacent cooling containers may remove the heat from the at least one electronic component and may overflow into the coolant pool. The coolant in the coolant pool may immerse a primary circuit board to remove heat from the primary circuit board. The coolant may later flow into the coolant collector and the circulation of the coolant may happen again to remove the heat from the plurality of electronic components of the electronic device, as discussed herein. The method 400 ends at block 410.

Since the electronic devices may not need to be completely submerged in the coolant, a vertically extending rack (e.g., the rack that extends along its height) can be used to stack the electronic devices one on top of other, thereby reducing the floor space required for deploying multiple electronic devices. For example, the rack can utilize the vertical space up to 50 U or 60 U, hence the floor space utilization is more optimized than the horizontally oriented rack. Further, since the electronic devices are not completely immersed in the coolant and also since the electronic devices are stacked vertically, each electronic device may be partially pulled from the rack, for accessing the electronic components within a corresponding electronic device and perform service and maintenance activity, without shutting down the corresponding electronic device. Also, each electronic device may require less coolant when compared to traditional immersion cooling, thereby reducing the weight of the electronic device and the rack. Further, since the existing infrastructure (e.g., the rack and the CDU) can be reused, the cost of deployment of the immersion cooling may be significantly reduced. Additionally, since the first cooling container that contains high-powered electronic components receives the coolant directly from the coolant loop and the second cooling container that contains low-powered electronic components receives the coolant from the first cooling container, the cooling and power usage effectiveness of each electronic device can be significantly improved.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An electronic device comprising:
   a chassis having an internal volume configured to be partly filled with a coolant to form a coolant pool in the internal volume;
   a plurality of electronic components disposed within the chassis;
   a plurality of cooling containers disposed within the chassis such that each cooling container among the plurality of cooling containers contains at least one electronic component among the plurality of electronic components; and
   a coolant loop configured to circulate the coolant from the coolant pool to the plurality of cooling containers,
   wherein each cooling container among the plurality of cooling containers is configured to:
      receive an inflow of the coolant from the coolant loop or from another one of the plurality of cooling containers and immerse the at least one electronic component in the coolant to remove heat from the at least one electronic component, and
      output an outflow of the coolant that overflows into the coolant pool in the chassis or into at least one adjacent cooling container of the plurality of cooling containers,
   wherein a level of the coolant in the coolant pool in the chassis is lower than respective levels of the coolant in the plurality of cooling containers.

2. The electronic device of claim 1, wherein the coolant loop comprises a pump, a heat exchanger, a manifold disposed within the chassis, and a coolant collector disposed within the coolant pool,
   wherein the heat exchanger is configured to receive the coolant from the coolant pool via the coolant collector, remove heat from the coolant, and output the coolant to the manifold, and
   wherein the pump is configured to drive the coolant to flow from the coolant collector to the plurality of cooling containers via the heat exchanger and the manifold.

3. The electronic device of claim 2, wherein the pump drives the coolant to the plurality of cooling containers at a constant flow rate.

4. The electronic device of claim 2, further comprising a controller and a plurality of temperature sensors, where each sensor is disposed in a corresponding cooling container among the plurality of cooling containers, wherein the controller is communicatively coupled to the plurality of temperature sensors and the pump, wherein each sensor detects temperature of the coolant in the corresponding cooling container and communicates detected temperature data to the controller, wherein the controller generates a control signal to the pump based on a comparison of the detected temperature data with a threshold temperature data, and wherein the pump drives the coolant to the plurality of cooling containers at a varied flow rate based on the control signal received from the controller.

5. The electronic device of claim 1, wherein the chassis is a liquid tight enclosure.

6. The electronic device of claim 1, wherein at least one cooling container among the plurality of cooling containers has a height that is different than at least one other cooling container among the plurality of cooling containers.

7. The electronic device of claim 1, further comprising:
   a primary circuit board, wherein a first subset of the plurality of electronic components are mounted on the primary circuit board and a second subset of the plurality of electronic components are not mounted on the primary circuit board;
   wherein the plurality of cooling containers comprises a first set of cooling containers and a second set of cooling containers,
   wherein each cooling container among the first set of cooling containers is disposed on the primary circuit board and contains at least one electronic component of the first subset, and
   wherein each cooling container among the second set of cooling containers is not disposed on the primary circuit board and contains at least one electronic component of the second subset.

8. The electronic device of claim 7, wherein each cooling container among the first set of cooling containers comprises vertical wall portions defining a lateral bounds of the cooling container, wherein the vertical wall portions are sealed liquid tight to the primary circuit board such that the primary circuit board defines a bottom bound of the cooling container.

9. The electronic device of claim 7, wherein one or more cooling containers among the second set of cooling containers are disposed on a base of the chassis.

10. The electronic device of claim 7, wherein at least part of the primary circuit board is disposed in the coolant pool in the internal volume of the chassis and immersed in the coolant to remove heat from the primary circuit board.

11. The electronic device of claim 7, wherein the first set of cooling containers comprises a first cooling container and a second cooling container, wherein the first cooling container comprises an inlet fluidically coupled to the coolant loop to receive the inflow of the coolant from the coolant loop, wherein the second cooling container is configured to receive a part of the outflow of the coolant overflowing from the first cooling container as the inflow of the coolant of the second cooling container, and wherein the outflow of the coolant of the second cooling container overflows into the coolant pool in the chassis.

12. The electronic device of claim 11, wherein the first cooling container comprises one or more outlets configured to guide the outflow of the coolant to the second cooling container.

13. The electronic device of claim 11, wherein the first set of cooling containers further comprises another second cooling container, wherein the other second cooling container is configured to receive another part of the outflow of the coolant overflowing from the first cooling container as the inflow of the coolant of the other second cooling container.

14. The electronic device of claim 13, wherein the first cooling container comprises a first outlet configured to guide the part of the outflow of the coolant to the second cooling container and a second outlet configured to guide the other part of the outflow of the coolant to the other second cooling container.

15. The electronic device of claim 1, further comprising one or more external communication ports disposed on a panel of the chassis, wherein the external communication port is disposed at a height greater than the level of the coolant in the coolant pool in the chassis.

16. The electronic device of claim 1, wherein one or more cooling containers among the plurality of cooling containers are fluidically connected to a pump via a manifold and a corresponding pipe among a plurality of pipes connected to the manifold, wherein respective diameters of the plurality of pipes vary depending on the respective levels of the coolant in corresponding cooling containers to which the plurality of pipes are connected, respectively, among the one or more cooling containers.

17. A rack comprising:
a plurality of enclosures;
a facility liquid supply unit disposed along a first enclosure among the plurality of enclosures, wherein the facility liquid supply unit comprises an inlet tube and an outlet tube; and the electronic device of claim 1, disposed in a second enclosure among the plurality of enclosures, where a heat exchanger of the electronic device is disposed in a thermal contact with the inlet tube and the outlet tube of the facility liquid supply unit to remove heat from the coolant.

18. The rack of claim 17, wherein the electronic device of claim 1, further comprising a removable top lid disposed on and coupled to the chassis, wherein, in a state of the electronic device being partially pulled out from the second enclosure, the removable top lid provides access to the plurality of electronic components disposed within the chassis.

19. A method comprising:
circulating a coolant from a coolant pool to a plurality of cooling containers via a coolant loop, wherein the coolant pool is formed from the coolant that is partly filled in an internal volume of a chassis of an electronic device;

receiving an inflow of the coolant by each cooling container among the plurality of cooling containers from the coolant loop or from another one of the plurality of cooling containers, and immerse at least one electronic component among a plurality of electronic components of the electronic device in the coolant to remove heat from the at least one electronic component, wherein the plurality of cooling containers is disposed within the chassis such that each cooling container contains the at least one electronic component; and outputting an outflow of the coolant from each cooling container that overflows into the coolant pool or into at least one adjacent cooling container of the plurality of cooling containers, wherein a level of the coolant in the coolant pool in the chassis is lower than respective levels of the coolant in the plurality of cooling containers.

20. The method of claim 19, wherein circulating the coolant via the coolant loop comprises:
receiving the coolant from a coolant collector disposed within the coolant pool by a heat exchanger; removing heat from the coolant, and outputting the coolant to a manifold; and
driving the coolant to flow from the coolant collector to the plurality of cooling containers by a pump via the heat exchanger and the manifold.

* * * * *